(12) United States Patent
Argento et al.

(10) Patent No.: US 11,789,046 B2
(45) Date of Patent: Oct. 17, 2023

(54) MEASURING A CHANGE IN VOLTAGE

(71) Applicant: STMicroelectronics S.r.l., Agrate Brianza (IT)

(72) Inventors: Davide Argento, Milan (IT); Orazio Pennisi, Pieve Emanuele (IT); Stefano Castorina, Milan (IT); Vanni Poletto, Milan (IT); Matteo Landini, Bareggio (IT); Andrea Maino, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 138 days.

(21) Appl. No.: 17/407,725

(22) Filed: Aug. 20, 2021

(65) Prior Publication Data

US 2023/0054951 A1    Feb. 23, 2023

(51) Int. Cl.
| | | |
|---|---|---|
| *G01R 19/10* | (2006.01) | |
| *H03M 1/12* | (2006.01) | |
| *H03M 3/00* | (2006.01) | |
| *B60R 21/017* | (2006.01) | |

(52) U.S. Cl.
CPC .......... *G01R 19/10* (2013.01); *B60R 21/0173* (2013.01); *H03M 1/124* (2013.01); *H03M 3/464* (2013.01); *H03M 3/494* (2013.01)

(58) Field of Classification Search
CPC .... G01R 19/10; G01R 31/64; G01R 27/2605; B60R 21/0173; H03M 1/124; H03M 3/464; H03M 3/494
See application file for complete search history.

(56) References Cited

U.S. PATENT DOCUMENTS

| | | |
|---|---|---|
| 4,243,933 A | 1/1981 | Rollman |
| 6,580,279 B1 | 6/2003 | Baumgartner et al. |
| 6,806,716 B2 | 10/2004 | Bertness et al. |
| 7,155,353 B2 | 12/2006 | Okamoto et al. |
| 7,324,902 B2 | 1/2008 | Verbrugge et al. |

(Continued)

FOREIGN PATENT DOCUMENTS

| | | |
|---|---|---|
| DE | 10319336 A1 | 11/2004 |
| EP | 0732793 A1 | 9/1996 |

(Continued)

OTHER PUBLICATIONS

ST Life. Augmented, "Automotive advanced airbag IC for mid/high end applications," Datasheet—Production Data, L9680, DS11615 Rev 2, Oct. 2018, 280 pages.

*Primary Examiner* — Jermele M Hollington
*Assistant Examiner* — Zannatul Ferdous
(74) *Attorney, Agent, or Firm* — Slater Matsil, LLP

(57) ABSTRACT

A system and method is provided for measuring a voltage drop at a node. In embodiments, a circuit includes an analog-to-digital converter, a current sink, and a controller. The input of the analog-to-digital converter and the input of the current sink is coupled to the node to be measured. A set point for the current sink is determined. The output of the analog-to-digital converter during the voltage drop is sampled. And a relative voltage drop value is computed by subtracting the sampled output of the analog-to-digital converter during the voltage drop from a sampled output of the analog-to-digital converter during a steady-state condition. The current sink operating at the set point during the steady-state condition and during the voltage drop.

23 Claims, 5 Drawing Sheets

(56) References Cited

U.S. PATENT DOCUMENTS

| | | |
|---|---|---|
| 7,477,038 B2 | 1/2009 | Taniguchi |
| 8,892,198 B2 | 11/2014 | Bohorquez et al. |
| 8,988,084 B2 | 3/2015 | Schumacher et al. |
| 2004/0162683 A1 | 8/2004 | Verbrugge et al. |
| 2005/0169018 A1 | 8/2005 | Hatai et al. |
| 2007/0030016 A1 | 2/2007 | Schumacher et al. |
| 2007/0252633 A1 | 11/2007 | Frankel et al. |
| 2009/0121725 A1* | 5/2009 | Hashimoto ...... G01R 31/31721 324/537 |
| 2009/0160459 A1 | 6/2009 | De Langen et al. |
| 2009/0206854 A1* | 8/2009 | Bernardon ............. G01R 27/14 324/713 |
| 2010/0177538 A1 | 7/2010 | Scherr |
| 2011/0125224 A1* | 5/2011 | Carbunaru ......... A61N 1/36071 607/66 |
| 2011/0133757 A1 | 6/2011 | Chae et al. |
| 2012/0068765 A1* | 3/2012 | Leonardo ................ H03F 1/083 330/103 |
| 2015/0222256 A1* | 8/2015 | Sasai .................... H03K 5/1252 327/551 |
| 2015/0260800 A1 | 9/2015 | Baba et al. |
| 2016/0131720 A1 | 5/2016 | Baba et al. |
| 2016/0274172 A1 | 9/2016 | Yoshida |
| 2017/0336463 A1 | 11/2017 | Makdessi et al. |
| 2020/0060574 A1 | 2/2020 | Lupton et al. |
| 2021/0173419 A1* | 6/2021 | Severson ............... G01K 7/425 |
| 2022/0043070 A1 | 2/2022 | Mallett et al. |

FOREIGN PATENT DOCUMENTS

| | | |
|---|---|---|
| EP | 1622795 A1 | 2/2006 |
| JP | H08336233 A | 12/1996 |
| JP | 2000219097 A | 8/2000 |

\* cited by examiner

MEASURING A CHANGE IN VOLTAGE

CROSS-REFERENCE TO RELATED APPLICATIONS

This application is related to co-pending U.S. patent application Ser. No. 17/407,747, filed on the same day as this application, entitled "Capacitor Measurement,", which application is hereby incorporated by reference herein in its entirety.

TECHNICAL FIELD

The present disclosure generally relates to electronic technology and, in particular embodiments, to systems, methods, and devices for measuring a change in voltage.

BACKGROUND

Modern vehicles are typically equipped with airbags, commonly referred to as a supplemental inflatable restraint system (SIR) or a supplemental restraint system (SRS). These systems are secondary to the vehicle's seat belt restraint system and used further to protect passengers in the event of a crash. A deployment circuit, which typically includes a microcontroller and an accelerometer, actuates a firing circuit of the supplemental restraint system during a collision. The firing circuit fires a squib upon command of the microcontroller, which deploys the vehicle's airbags.

A dependable electrical energy source for the reliable operation of the system is essential. Typically, the vehicle ignition voltage provides power to the system through the vehicle's primary battery. However, in some instances, during a collision, the vehicle's primary battery can become disconnected or inaccessible to the supplemental restraint system. A known solution is to provide a reserve capacitor (i.e., energy reserve source) connected to the system—the reserve capacitor provides power when the vehicle's primary battery becomes unreachable. A reliable system to monitor the operation of the reserve capacitor is desirable.

SUMMARY

Technical advantages are generally achieved, by embodiments of this disclosure which describe systems, methods, and devices for measuring a change in voltage.

A first aspect relates to a method for measuring a voltage drop at a node. The method includes having a circuit with an analog-to-digital converter, a current sink, and a controller, an input of the analog-to-digital converter and an input of the current sink coupled to the node; determining a set point for the current sink; sampling an output of the analog-to-digital converter during the voltage drop; and computing a relative voltage drop value that includes subtracting the sampled output of the analog-to-digital converter during the voltage drop from a sampled output of the analog-to-digital converter during a steady-state condition, the current sink operating at the set point during the steady-state condition and during the voltage drop.

In a first implementation form of the method according to the first aspect as such, the determining the set point for the current sink includes sampling a first output of the analog-to-digital converter during a second steady-state condition, the current sink disabled during the second steady-state condition; and selectively adjusting an amount of current sunk through the current sink until the output of the analog-to-digital converter is at a targeted value relative to the first output.

In a second implementation form of the method according to the first aspect as such or any preceding implementation of the first aspect, selectively adjusting the amount of current sunk through the current sink includes monitoring the output of the analog-to-digital converter; adjusting the amount of current sunk by a control signal generated by the controller based on monitoring the output of the analog-to-digital converter; and communicating the control signal to a digital-to-analog converter (DAC) of the current sink.

In a third implementation form of the method according to the first aspect as such or any preceding implementation of the first aspect, the targeted value corresponds to a ratio between 9.9 and 10.1 percent.

In a fourth implementation form of the method according to the first aspect as such or any preceding implementation of the first aspect, wherein the voltage drop comprises enabling a discharge switch coupled to the node such that a voltage at the node drops in value.

In a fifth implementation form of the method according to the first aspect as such, or any preceding implementation of the first aspect, the method further includes computing a voltage drop value at the node based on a linear relationship between the voltage drop and the relative voltage drop value.

In a sixth implementation form of the method according to the first aspect as such, or any preceding implementation of the first aspect, the set point is chosen to prevent the analog-to-digital converter from saturating.

In a seventh implementation form of the method according to the first aspect as such, or any preceding implementation of the first aspect, the node is a node of a reserve capacitor of a supplemental restraint system (SRS) in a vehicle.

A second aspect relates to a circuit for measuring a voltage drop at a node. The circuit includes an analog-to-digital converter (ADC) coupled to the node; a current sink coupled to the node and an input of the analog-to-digital converter, the current sink configured to be adjusted via a control signal to selectively adjust an amount of current sunk through the current sink; and a controller coupled to an output of the analog-to-digital converter and a control input of the current sink. The controller is configured to determine a set point for the current sink; sample an output of the analog-to-digital converter during the voltage drop; and compute a relative voltage drop value comprising subtracting the sampled output of the analog-to-digital converter during the voltage drop from a sampled output of the analog-to-digital converter during a steady-state condition, the current sink operating at the set point during the steady-state condition and during the voltage drop.

In a first implementation form of the circuit according to the second aspect as such, the current sink includes a digital-to-analog converter (ADC) and a load.

In a second implementation form of the circuit according to the second aspect as such or any preceding implementation of the second aspect, the determining the set point for the current sink includes sampling a first output of the analog-to-digital converter during a second steady-state condition, the current sink disabled during the second steady-state condition; and selectively adjusting an amount of current sunk through the current sink until the output of the analog-to-digital converter is at a targeted value relative to the first output.

In a third implementation form of the circuit according to the second aspect as such or any preceding implementation of the second aspect, the selectively adjusting the amount of current sunk through the current sink includes monitoring the output of the analog-to-digital converter; adjusting the amount of current sunk by a control signal generated by the controller based on monitoring the output of the analog-to-digital converter; and communicating the control signal to a digital-to-analog converter (DAC) of the current sink.

In a fourth implementation form of the circuit according to the second aspect as such or any preceding implementation of the second aspect, the node is coupled to a discharge circuit, the voltage drop corresponds to enabling a discharge switch of the discharge circuit coupled to the node such that a voltage at the node drops in value.

In a fifth implementation form of the circuit according to the second aspect as such or any preceding implementation of the second aspect, the controller is further configured to compute a voltage drop value at the node based on a linear relationship between the voltage drop and the relative voltage drop value.

In a sixth implementation form of the circuit according to the second aspect as such or any preceding implementation of the second aspect, the set point is chosen to prevent the analog-to-digital converter from saturating.

In a seventh implementation form of the circuit according to the second aspect as such or any preceding implementation of the second aspect, the analog-to-digital converter is a sigma-delta ($\Sigma$-$\Delta$) and the controller is a proportional-integral-derivative (PID) controller.

In an eight implementation form of the circuit according to the second aspect as such or any preceding implementation of the second aspect, the node is a node of a reserve capacitor in a supplemental restraint system (SRS) of a vehicle.

A third aspect relates to a system. The system includes a capacitor having a first node; an analog-to-digital converter (ADC) coupled to the first node; a current sink coupled to the first node and an input of the analog-to-digital converter, the current sink configured to be adjusted via a control signal to selectively adjust an amount of current sunk through the current sink; and a controller coupled to an output of the analog-to-digital converter and a control input of the current sink. The controller is configured to determine a set point for the current sink; sample an output of the analog-to-digital converter during a voltage drop at the first node; and compute a relative voltage drop value comprising subtracting the sampled output of the analog-to-digital converter during the voltage drop from a sampled output of the analog-to-digital converter during a steady-state condition, the current sink operating at the set point during the steady-state condition and during the voltage drop.

In a first implementation form of the system according to the third aspect as such, the determining the set point for the current sink includes sampling a first output of the analog-to-digital converter during a second steady-state condition, the current sink disabled during the second steady-state condition; and selectively adjusting an amount of current sunk through the current sink until the output of the analog-to-digital converter is at a targeted value relative to the first output.

In a second implementation form of the system according to the third aspect as such or any preceding implementation of the third aspect, the selectively adjusting the amount of current sunk through the current sink includes monitoring the output of the analog-to-digital converter; adjusting the amount of current sunk by a control signal generated by the controller based on monitoring the output of the analog-to-digital converter; and communicating the control signal to a digital-to-analog converter (DAC) of the current sink.

In a third implementation form of the system according to the third aspect as such or any preceding implementation of the third aspect, the system further includes a discharge circuit coupled to the capacitor via the first node, the voltage drop corresponds to enabling a discharge switch of the discharge circuit coupled to the first node such that a voltage at the first node drops in value.

In a fourth implementation form of the system according to the third aspect as such or any preceding implementation of the third aspect, the set point is chosen to prevent the analog-to-digital converter from saturating.

In a fifth implementation form of the system according to the third aspect as such or any preceding implementation of the third aspect, the capacitor is a reserve capacitor of a supplemental restraint system (SRS) of a vehicle.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1A:
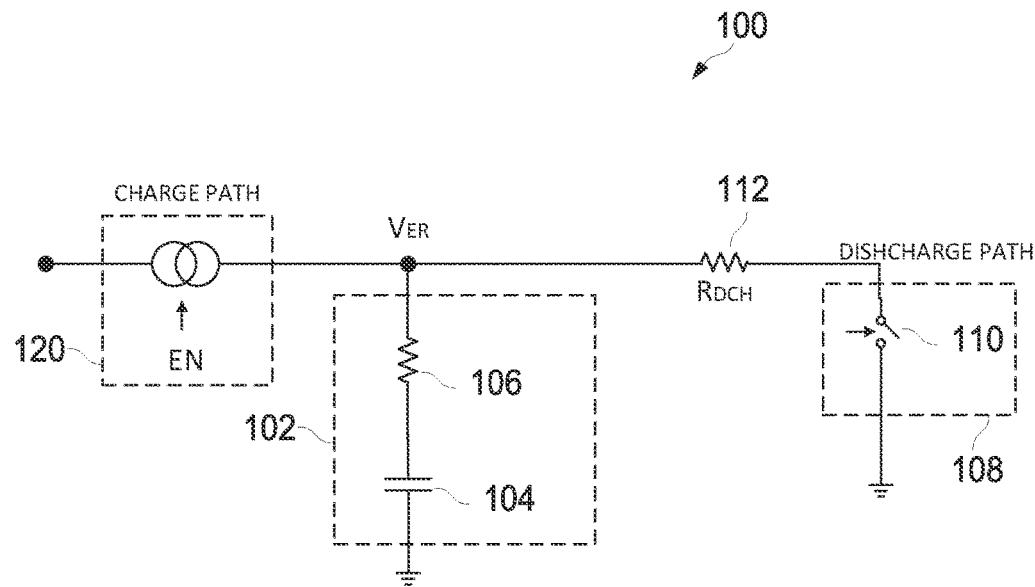
FIG. 1a is a circuit model of an embodiment reserve capacitor.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

While inventive aspects are described primarily in the context of a reserve capacitor of a supplemental restraint system (SRS), the inventive aspects may be similarly applicable to any electronic device that can profit from the measurement of a voltage drop over an unknown voltage baseline.

Generally, a vehicle's supplemental restraint system includes one or more reserve capacitors that provide an alternative energy source for the system if the primary energy source (e.g., vehicle's primary battery) becomes disabled or inaccessible. During regular operation, a charging circuit charges the reserve capacitor through, for example, the vehicle's primary battery. Typically, the reserve capacitor is isolated from the deployment circuit to minimize the load on the charging circuit. In the event of a crash and the absence of the primary energy source, an isolation circuit detects vehicle ignition voltage loss and connects the reserve capacitor to the deployment circuit for the continued operation of the supplemental restraint system.

An airbag control module of the supplemental restraint system cyclically evaluates for hardware failures and communicates any errors with the vehicle's diagnostic computer through a diagnostic trouble code (DTC). In response, the vehicle's dash panel displays errors through, for example, a flashing airbag warning light to the user. Embodiments of this disclosure can be used to determine the health of the reserve capacitor and provide a diagnostic trouble code to alert the vehicle owner of issues related to the supplemental restraint system.

Embodiments of this disclosure provide an application-specific integrated or standalone circuit used in combination with a circuit implemented in a standard supplemental restraint system. In combination, the circuits provide various functions, such as power management, deployment functionality for drivers (e.g., supporting both squib and low-energy actuator loads), deployment functionality for regulators, remote sensor interfaces (e.g., supporting Peripheral Sensor Interface 5 (PSI5) satellite sensors), diagnostic functionality, deployment arming, hall-effect sensor interfaces, switch sensor interfaces, general-purpose low-side drivers, watchdog functionality, local internet network (LIN) interface, and the like.

Aspects of this disclosure include an improved technique over existing circuits that suffer from a small dynamic range or low-resolution accuracy. In contrast, systems and methods disclosed herein improve the dynamic range over which the baseline voltage can operate while maintaining a high-resolution accuracy. In particular embodiments, the measurement techniques provide an improved system and method to measure the proper functioning of a reserve capacitor used in a supplemental restraint system.

In embodiments, a circuit includes an analog-to-digital converter (ADC), a controller, and a controllable current sink. The circuit is coupled to a capacitor (e.g., reserve capacitor) that is to be measured. The analog-to-digital converter generates a digital equivalent of the analog voltage at the terminal of the capacitor. The controller monitors the output of the analog-to-digital converter and controls the amount of current sunk at the controllable current sink using a control signal.

In an initial step and during the steady-state condition of the capacitor, the controller monitors the voltage across the capacitor while adjusting the amount of current sunk through the controllable current sink. A desired target (e.g., 10%) of the measured digital equivalent of the analog voltage at the terminal between (1) steady-state condition and (2) controllable current sink enabled is selected to optimize the analog-to-digital converter operating range and prevent the analog-to-digital converter from saturating.

Once the controller determines the proper setting for the controllable current sink to achieve the desired target, the control signal from the controller to the current sink is frozen in value. Thus, once the control signal is frozen, the digital output of the analog-to-digital converter is a known ratio of the voltage value at the terminal of the capacitor.

In a second step, a discharge circuit coupled to the terminal of the capacitor is enabled that causes a drop in voltage at the capacitor from a first time to a second time. The controller continuously monitors the output of the analog-to-digital converter until, for example, the discharge circuit is disabled at the second time. The absolute difference of the capacitor's output from the first time to the second time is computed. Because the difference is related to the voltage drop at the capacitor given a known constant based on the desired target, the drop in voltage at the capacitor is computed. These and other details are discussed in greater detail below.

FIG. 1a illustrates a circuit model 100 of an embodiment reserve capacitor 102, which in addition to the model capacitor 104 includes an equivalent series resistor (ESR) 106. In embodiments, the reserve capacitor 102 is an auxiliary source used to power a vehicle's supplemental restraint system as an alternative power source to the primary vehicle battery.

It is desirable to periodically monitor the reserve capacitor 102 for proper operation. At set intervals, the equivalent series resistor and capacitance values of reserve capacitor 102 are measured during a discharge routine of reserve capacitor 102 through the discharge circuit 108.

Charge circuit 120 is coupled to reserve capacitor 102. Charge circuit 120 provides a controllable (e.g., serial peripheral interface (SPI), etc.), low-ohmic path that, when enabled, allows reserve capacitor 102 to charge during a charge routine of reserve capacitor 102.

Discharge circuit 108 provides a controllable (e.g., serial peripheral interface (SPI), etc.), low-ohmic path that allows reserve capacitor 102 to discharge during a discharge routine of reserve capacitor 102.

Discharge circuit 108 includes a discharge switch 110. A discharge resistor 112 is coupled to discharge circuit 108. When discharge switch 110 is activated, for example during a discharge routine, current is dissipated through discharge resistor 112.

The arrangement of components shown in FIG. 1a may (or may not) be arranged as shown. Further, discharge circuit 108 may include additional or fewer components as shown with the purpose of having a discharge path being provided for reserve capacitor 102 when discharge switch 110 is in the closed position.

In embodiments, discharge switch 110 is a metal-oxide-semiconductor field-effect transistor (MOSFET). Optionally, discharge circuit 108 may include a diode in series between discharge switch 110 and discharge resistor 112. Although, as shown, discharge circuit 108 is arranged between discharge resistor 112 and a reference voltage, in embodiments, the discharge resistor 112 is coupled in series between discharge switch 110 and a reference voltage.

In embodiments, discharge resistor 112 is located away from the circuit of circuit model 100 to minimize power dissipation and reduce circuit temperature during a discharge routine.

Figure 1B:
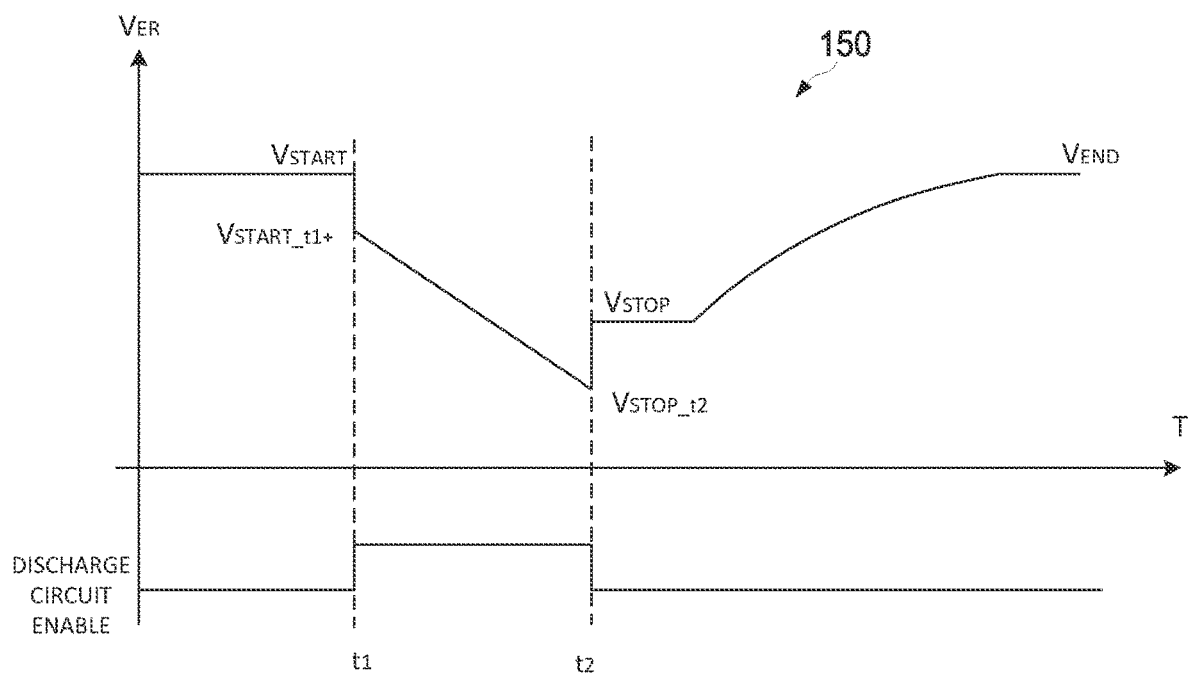
FIG. 1b is a timing diagram for a voltage discharge at a capacitor during a discharge routine.

FIG. 1b illustrates a timing diagram 150 for the $V_{ER}$ voltage during a discharge routine of reserve capacitor 102. Before time $t_1$, discharge circuit 108 is disabled, and the $V_{ER}$ voltage corresponds to the steady-state voltage value $V_{START}$.

At time $t_1$, discharge circuit 108 is enabled through discharge switch 110. In response, reserve capacitor 102 is immediately discharged to a voltage value $V_{START\_t1+}$. The sharp drop in voltage at time $t_1$ generally corresponds to the non-zero equivalent series resistor value of reserve capacitor 102.

From time $t_1$ until time $t_2$, while discharge circuit 108 remains enabled and charge circuit 120 is disabled, reserve capacitor 102 is constantly discharged until it reaches a voltage value $V_{STOP\_t2}$.

At time $t_2$, discharge circuit 108 is disabled, and charge circuit 120 is enabled. In response, reserve capacitor 102 is immediately charged to an initial voltage value $V_{STOP}$. Gradually thereafter, reserve capacitor 102 is recharged to the steady-state voltage value $V_{END}$.

Embodiments of this disclosure provide systems and methods to measure the voltage drop at reserve capacitor 102 during the discharge routine from slightly before time $t_1$ (e.g., 64 microseconds before time $t_1$) to slightly after time $t_2$ (e.g., 64 microseconds after time $t_2$).

The typical operating value of reserve capacitor 102 in a supplemental restraint system configuration is a selectable voltage output between 20 and 33 volts. In embodiments, the voltage of the fully charged reserve capacitor 102 is approximately 33 Volts (V). In such an embodiment, the voltage drop at time $t_1$ is approximately 600 millivolts (mV).

Figure 2:
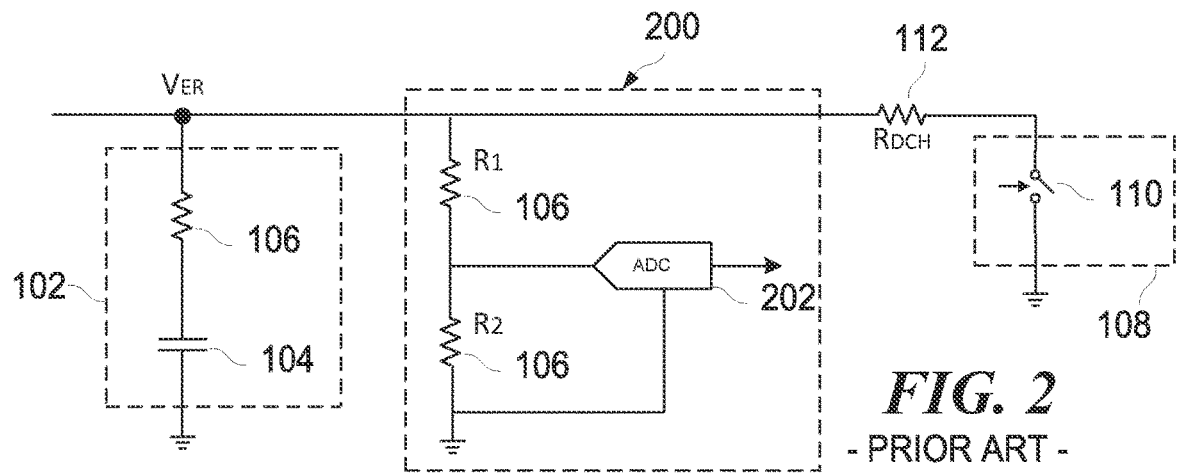
FIG. 2 is a prior art circuit used to measure a voltage drop during a discharge routine of a capacitor.

FIG. 2 illustrates a prior art circuit 200 used to measure a $V_{ER}$ voltage drop during a discharge routine of reserve capacitor 102. Circuit 200 includes an analog-to-digital converter 202, discharge circuit 108, $R_1$ resistor 204a, and $R_2$ resistor 204b. The arrangement of $R_1$ and $R_2$ resistors 204a-b provides a resistor divider at the input of analog-to-digital converter 202. At time $t_1$ and $t_2$, the ratioed (due to the resistor divider) $V_{ER}$ voltage is converted to a digital value using analog-to-digital converter 202. The difference between the voltages at time $t_1$ and $t_2$ is computed to determine the voltage drop. Disadvantageously, circuit 200 is not extensible over a wide operating voltage range because as the baseline voltage $V_{ER}$ increases, the resolution accuracy of measured delta voltage decreases. Thus, circuit 200 suffers from a trade-off between input range and resolution accuracy.

Figure 3:
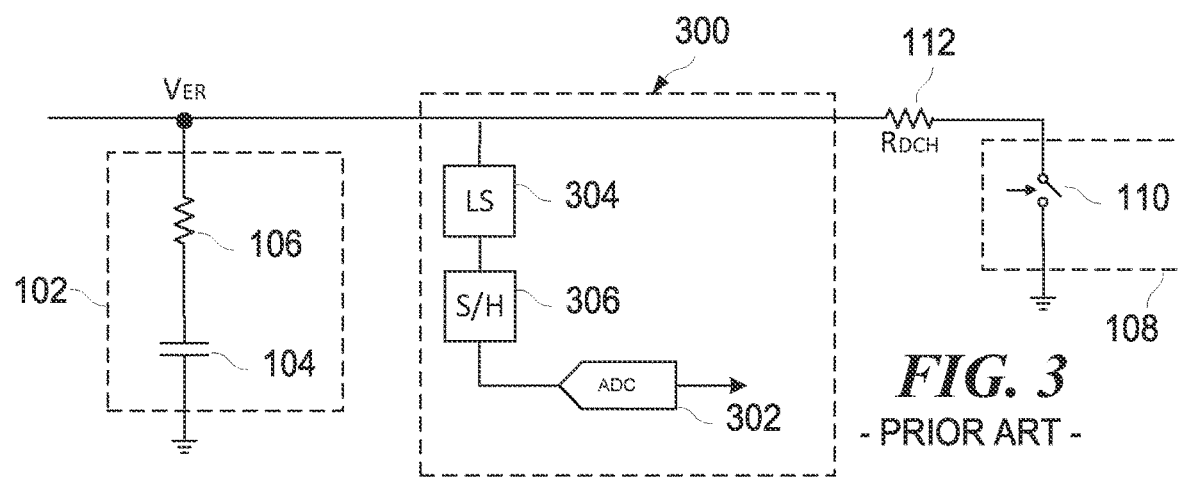
FIG. 3 is another prior art circuit used to measure a voltage drop during a discharge routine of a capacitor.

FIG. 3 illustrates a prior art circuit 300 used to measure a $V_{ER}$ voltage drop during a discharge routine of reserve capacitor 102. Circuit 300 includes an analog-to-digital converter (ADC) 302, level shifter 304, and a sample/hold circuit 306. By enabling and disabling various switches (e.g., transistors) in the level shifter 304 and the sample/hold circuit 306, multiple samples of the $V_{ER}$ voltage are recorded. A first sample is held when $V_{ER}$ is in a steady-state condition. Multiple samples are then held during the enablement of discharge circuit 108. By comparing the various samples to the steady-state condition, circuit 300 determines the voltage drop at $V_{ER}$. Disadvantageously, circuit 300 requires at least a capacitor and switch for each sample that is to be held, which can significantly increase the footprint of circuit 300. Further, leakages at various switches can significantly undermine voltage drop measurement accuracy.

Figure 4:
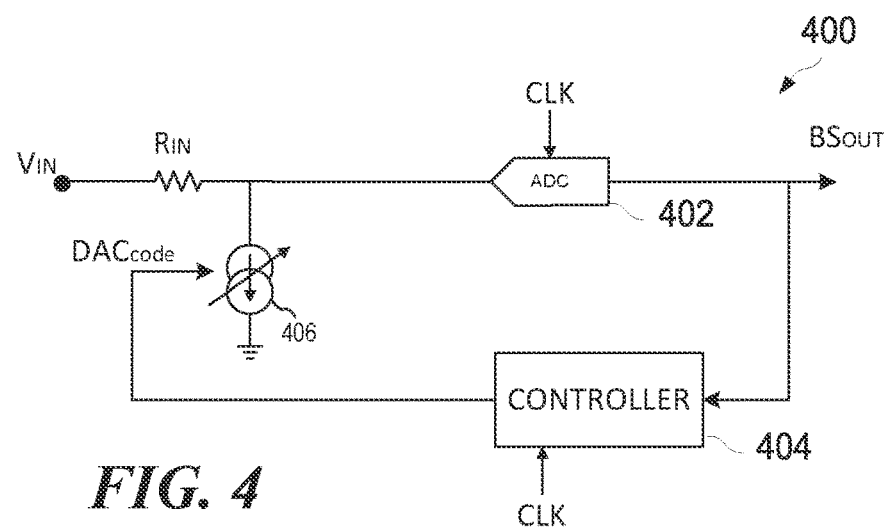
FIG. 4 is an embodiment circuit used to measure a voltage change.

FIG. 4 illustrates an embodiment circuit 400 used to measure a voltage change at the node $V_{IN}$ with improved dynamic range and resolution in comparison to circuits 200 and 300. Circuit 400 includes an analog-to-digital converter 402, controller 404, and a controllable current sink 406, which may (or may not) be arranged as shown.

Analog-to-digital converter 402 can be a general analog-to-digital converter, a sigma-delta (Σ-Δ) analog-to-digital converter, or the like. Controller 404 can be a digital controller, a proportional-integral-derivative (PID) controller, or the like. Current sink 406 is an adjustable current source equipped with a digital-to-analog converter (DAC) and a load (not shown). Analog-to-digital converter 402 and controller 404 include a clock signal input from a clock generator (not shown) to synchronize operation.

Controller 404 is additionally configured to perform computations or other processing-related tasks related to the methods disclosed herein. Controller 404 can be, for example, a logic circuit, a microprocessor, a microcontroller, a control circuit, a digital signal processor, a field-programmable gate array (FPGA), an application-specific integrated circuit (ASIC), a system-on-chip (SoC), or combinations thereof.

Circuit 400 is shown to have a single controller 404; however, in some embodiments, circuit 400 may include other components that, in combination, perform the various functions herein attributed to controller 404. In embodiments, controller 404 may be a dedicated circuit. In other embodiments, controller 404 may refer to an existing processing unit of a system integrating the circuit 400.

In embodiments, controller 404 may include a memory to store programming or instructions for execution by controller 404. The memory can include a non-transitory computer-readable medium. The non-transitory computer-readable medium can include all types of computer-readable media, including magnetic storage media, optical storage media, flash media, and solid-state storage media. The memory can be embedded with controller 404 or a dedicated memory storage for storing instructions or data. Controller 404 can alternatively be coupled to an existing memory of a device that incorporates circuit 400.

It should be understood that software can be installed in and sold with circuit 400. Alternatively, the software can be obtained and loaded into circuit 400, including obtaining the software through a physical medium or distribution system, including, for example, from a server owned by the software creator or from a server not owned but used by the software creator. The software can be stored on a server for distribution over the Internet, for example.

The input to analog-to-digital converter 402 is an analog signal proportional to $V_{IN}$. The output of analog-to-digital converter 402 is a corresponding digital signal $BS_{OUT}$. During a condition where current sink 406 is at a constant value, a change in $BS_{OUT}$ ($\Delta BS_{OUT}$) relative to a change in $V_{IN}$ ($\Delta V_{IN}$) can be calculated using the equation $\Delta BS_{OUT} = -\alpha \Delta V_{IN}$, where α is a constant integer. It is noted that the constant integer value of α depends on a selection of components of circuit 400, as further described in FIG. 7.

Controller 404 is coupled to the digital-to-analog converter of current sink 406, allowing controller 404 to control current sink 406 via a control signal. The control signal from controller 404 adjusts the amount of current flow from the $V_{IN}$ node through a load of current sink 406. Because $BS_{OUT}$ is a known proportional equivalent of $V_{IN}$, by sinking a known amount of current—configurable through controller 404—through current sink 406, one can increase the operating range of circuit 400. As circuit 400 operates independently from the absolute value of $V_{IN}$, circuit 400 can measure a voltage drop at $V_{IN}$ with high-resolution accuracy while maintaining a large $V_{IN}$ voltage dynamic range.

Figure 5:
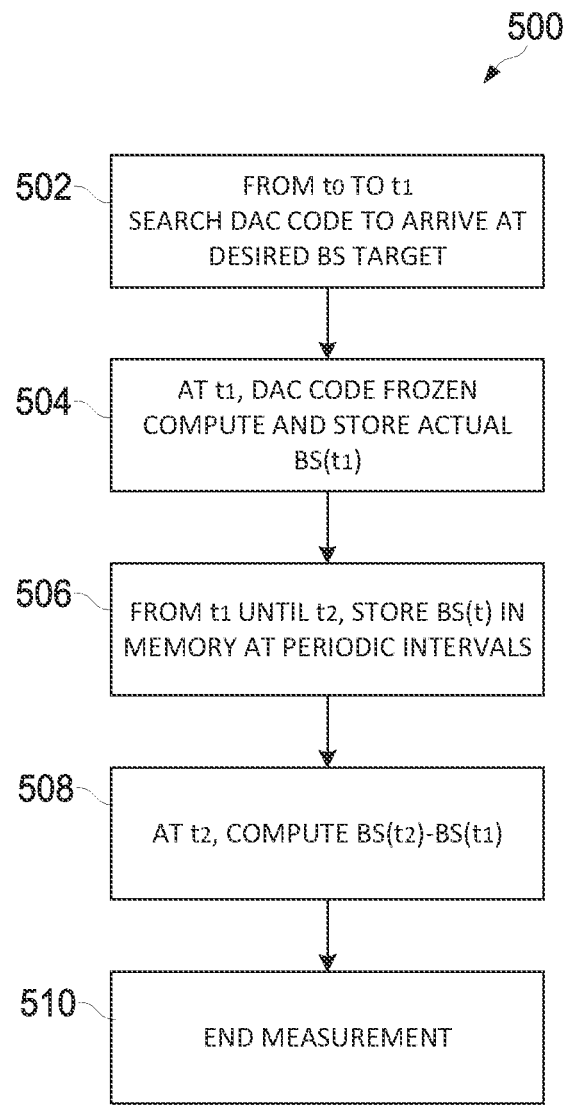
FIG. 5 is a flowchart of an embodiment method for measuring a voltage change, as may be performed by the circuit of FIG. 4.

FIG. 5 is a flowchart of an embodiment method 500 for measuring a voltage change at the node $V_{IN}$, as may be performed by circuit 400.

Figure 6:
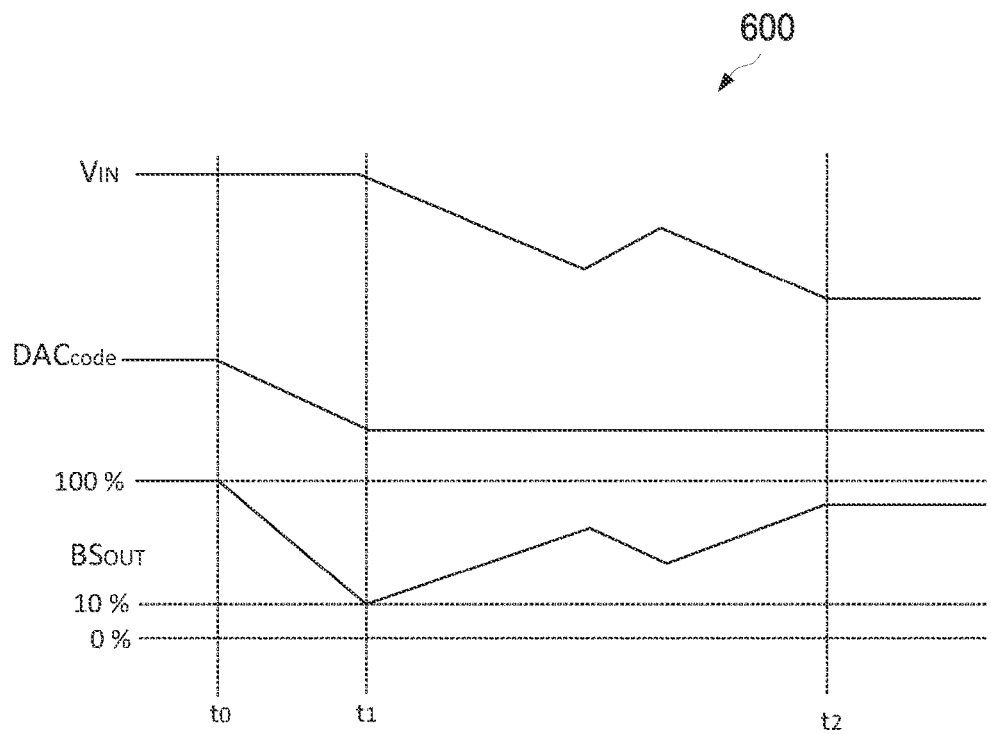
FIG. 6 is an embodiment timing diagram corresponding to the method discussed in FIG. 5.

FIG. 6 illustrates an embodiment timing diagram 600 corresponding to the method 500 discussed in FIG. 5. At step 502, from time $t_0$ to time $t_1$, while $V_{IN}$ remains in the steady-state condition, controller 404 provides a variable control signal to current sink 406. While controller 404 varies the current sunk through current sink 406, controller 404 monitors the varying digital value $BS_{OUT}$ until a desired $BS_{OUT\_TARGET}$ is reached. The desired $BS_{OUT\_TARGET}$ is selected to optimize the range of analog-to-digital converter 402 and to avoid saturation of analog-to-digital converter 402.

In embodiments, due to the limitations in the quantization of an analog signal to a digital signal by analog-to-digital converter 402, the actual $BS_{OUT\_TARGET}$ value may not be exactly equivalent to the desired value. In such an embodiment, controller 404 may adjust the ratio to an unwanted value slightly above or below the initially desired ratio based on determining that samples around the anticipated set point more closely achieve the desired ratio based on, for example, the analog equivalent.

At step 504, once the desired $BS_{OUT\_TARGET}$ value is reached, controller 404 stores and maintains (i.e., freezes) the control signal value ($DAC_{code}$) in memory, which is sent to current sink 406 such that the amount of current sunk through current sink 406 remains at the steady value determined at step 502. In embodiments, once the $DAC_{code}$ is frozen, since the $DAC_{code}$ selected may correspond to an unwanted $BS_{OUT\_TARGET}$ slightly different from the one selected, a new measurement is run, and controller 404 stores $BS_{OUT}(t_1)$.

For example, when the loop is tracking the $BS_{OUT\_TARGET}$ equal to 10%, the selected code, which has to be an integer number, may change between two consecutive codes (e.g., 124 and 125, with ideal code equal to 124.5). Thus, once one of the two consecutive codes is selected (e.g., the closest one between 124 or 125), the $BS_{OUT}$ may slightly differ from $BS_{OUT\_TARGET}$. For this reason, a new measurement is run, and controller 404 stores $BS_{OUT}(t_1)$ that may be 9.9% or 10.1% instead of an ideal 10%.

In the embodiment timing diagram illustrated in FIG. 6, the control signal value $DAC_{code}$ begins at a high value. The control signal value $DAC_{code}$ is gradually decreased by controller 404. At time $t_1$, controller 404 determines that the control signal value $DAC_{code}$ to reach a desired 10% $BS_{OUT\_TARGET}$ value and freezes the control signal value $DAC_{code}$.

It is noted that the process which controller 404 follows to determine the control signal value $DAC_{code}$ that results in achieving the desired ratio is not limited to the timing diagram embodiment of FIG. 6. For example, the control signal value $DAC_{code}$ may need to increase in value for current sink 406 to begin operating. As another example, controller 404 can be a proportional-integral-derivative (PID) controller that utilizes a closed-loop feedback control system. In this example, the proportional-integral-derivative controller drives current sink 406 until the desired $BS_{OUT\_TARGET}$ value is reached.

By setting the current sink 406 to sink enough current to reach the $BS_{OUT\_TARGET}$ value, circuit 400 allows for an improved dynamic operating range to monitor the $V_{IN}$ voltage. Further, once the control signal value ($DAC_{code}$ is set, because the equation $\Delta BS_{OUT}=\alpha \Delta V_{IN}$ remains valid, controller 404 can compute a drop in $V_{IN}$ voltage by monitoring $BS_{OUT}(t_2)$ in reference to $BS_{OUT}(t_1)$.

At step 506 and at time $t_1$, the control signal value $DAC_{code}$ is set by controller 404 to achieve the desired $BS_{OUT\_TARGET}$ value. Further, at time $t_1$, discharge switch 110 is enabled, and the $V_{IN}$ voltage begins to drop in value. From time $t_1$ to time $t_2$ and at periodic intervals, controller 404 samples the $BS_{OUT}$ value at the output of analog-to-digital converter 402. In an embodiment, controller 404 samples $BS_{OUT}$ every 64 microseconds (μs). In embodiments, the sampling is set to achieve acceptable granularity based on the duration that the discharge circuit 108 remains enabled.

At step 508 and at time $t_2$, discharge switch 110 is disabled, and $V_{IN}$ no longer drops in value. Because the various components of circuit 400 are synchronized with a clock signal, at time $t_2$ (or slightly beforehand), controller 404 samples $BS_{OUT}(t_2)$, and computes a difference between $BS_{OUT}(t_2)$ and $BS_{OUT}(t_1)$ (i.e., $\Delta BS_{OUT}=BS_{OUT}(t_2)-BS_{OUT}(t_1)$). Because the update equation of $\Delta BS_{OUT}=-\alpha \Delta V_{IN}$, controller 404 can compute the voltage drop $V_{IN}$ ($\Delta V_{IN}$) during, for example, a discharge routine of reserve capacitor 102.

At step 510, the measurement ends. It should be noted that any drop is known by equation $\Delta BS_{OUT}=\alpha \Delta V_{IN}$ that corresponds to $BS_{OUT}(t_x)-BS_{OUT}(t_y)=-\alpha(V_{IN}(t_x)-V_{IN}(t_y))$, where x and y are integers and x>y.

It is noted that the order of steps shown in FIG. 5 is not absolutely required, so in principle, the various steps may be performed out of the illustrated order. Also, certain steps may be skipped, different steps may be added or substituted, or selected steps or groups of steps may be performed in a separate application.

Embodiments of this disclosure can measure a voltage drop across a baseline voltage. In embodiments, the baseline voltage is 20 to 30 Volts. In such an embodiment, the voltage drop can be measured with an accuracy of 10-15 milliVolts and with a resolution of 1 milliVolt.

Figure 7:
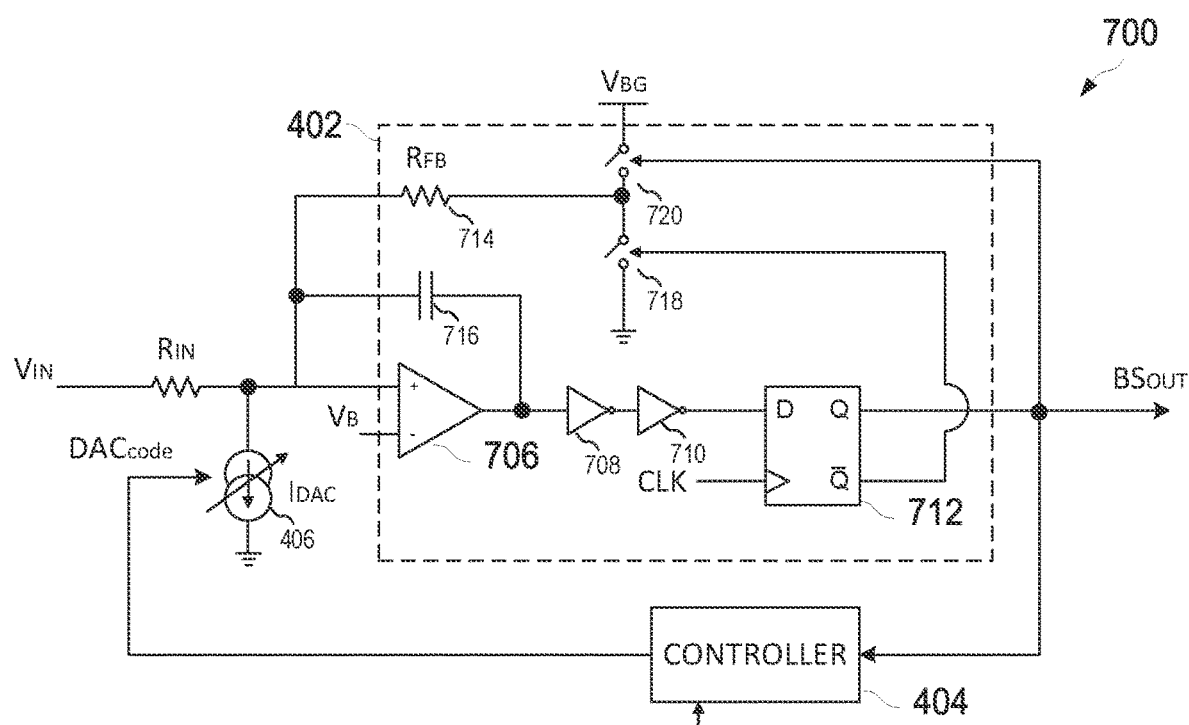
FIG. 7 is an embodiment circuit used to measure a voltage change.

FIG. 7 illustrates an embodiment circuit 700 used to measure a voltage change at the node $V_{IN}$. As shown, analog-to-digital converter 402 is shown as a sigma-delta (Σ-Δ) first-order time-continuous analog-to-digital converter. Analog-to-digital converter 402 is shown to include a differential amplifier 706, integrator 708, comparator 710, flip-flop 712, $R_{FB}$ resistor 714, capacitor 716, switches 718 and 720, which may (or may not) be arranged as shown. Further, analog-to-digital converter 402 is not limited to the circuit arrangement as shown, and any type of sigma-delta (Σ-Δ) type analog-to-digital converter may be used in circuit 700 to achieve similar results.

The value of current ($I_{DAC}(t)$) sunk through current sink 406 is provided by the equation:

$$I_{DAC}(t) = \frac{BS_{OUT}(t) \times V_{BG} - V_B}{R_{FB}} + \frac{V_{IN}(t) - V_B}{R_{IN}}.$$

By reformulating the equation for $BS_{OUT}(t)$, the equation can be written as:

$$BS_{OUT}(t) = \frac{R_{FB}}{V_{BG}} \times \left( I_{DAC}(t) - \frac{V_{IN}(t)}{R_{IN}} + \frac{V_B}{R_{IN}} + \frac{V_B}{R_{FB}} \right)$$

Based on the above, to compute $\Delta BS_{OUT}=BS_{OUT}(t_2)-BS_{OUT}(t_1)$, the following equation is provided:

$$\Delta BS_{OUT} = \frac{R_{FB}}{V_{BG}} \times \left( I_{DAC}(t_2) - \frac{V_{IN}(t_2)}{R_{IN}} \right) - \frac{R_{FB}}{V_{BG}} \times \left( I_{DAC}(t_1) - \frac{V_{IN}(t_1)}{R_{IN}} \right)$$

While the control signal value ($DAC_{code}$) is set, $I_{DAC}(t_2)=I_{DAC}(t_1)$, as is during, for example, steps 508 and 510 above. A change in the $V_{IN}$ voltage ($\Delta V_{IN}$) can, thus, be computed by:

$$\Delta BS_{OUT} = -\frac{R_{FB}}{R_{IN}} \times \left(\frac{V_{IN}(t_2) - V_{IN}(t_1)}{V_{BG}}\right)$$

$$\Delta BS_{OUT} = -\frac{R_{FB}}{R_{IN}} \times \left(\frac{\Delta V_{IN}}{V_{BG}}\right),$$

assuming $$\propto = \frac{R_{FB}}{V_{BG} \times R_{IN}},$$

$\Delta BS_{OUT}$ is related to $\Delta V_{IN}$ as:

$$\Delta BS_{OUT} = -\propto \Delta V_{IN}.$$

Figure 8:
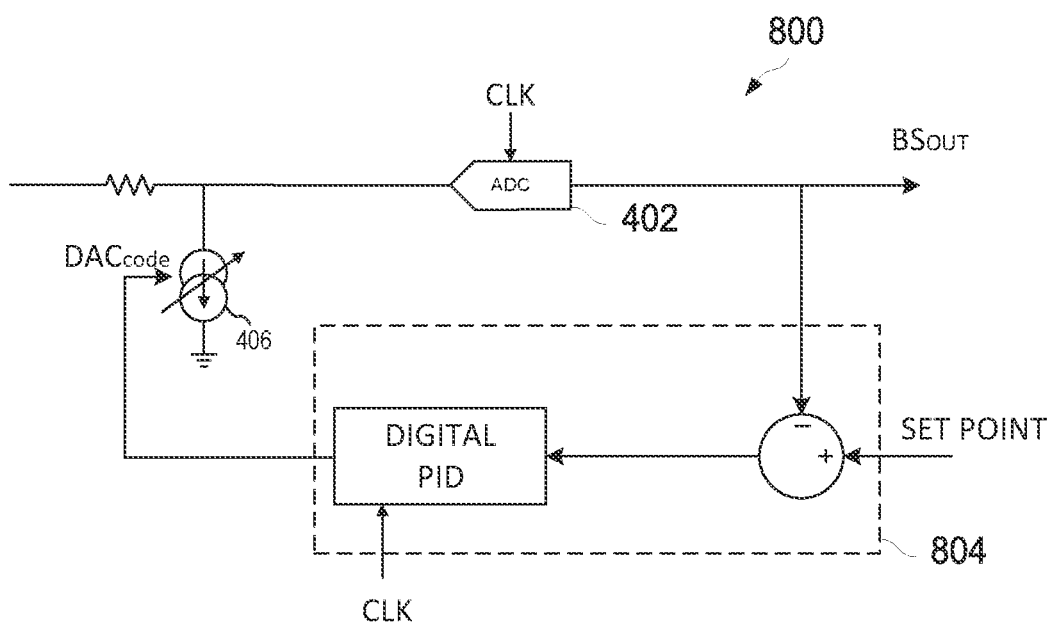
FIG. 8 is an embodiment circuit used to measure a voltage change.

FIG. 8 illustrates an embodiment circuit 800 used to measure a voltage change at the node $V_{IN}$. In contrast with FIG. 4, circuit 800 includes a proportional-integral-derivative (PID) controller 804. In embodiments, the PID controller 804 is limited to the integral type. The input set point to the PID controller 804 is the desired input for controlling the initial setting of the output of analog-to-digital converter 402 ($BS_{OUT}$) at which the measurement of the voltage variation begins. The operation of circuit 800 is similar to that disclosed with reference to FIGS. 4-6, with the exception that PID controller 804 uses a closed-loop feedback system to determine the control signal to adjust current sink 406 to achieve the desired target to optimize the analog-to-digital converter 402 operating range and prevent the analog-to-digital converter 402 from saturating.

Unless otherwise specified, when reference is made to two elements electrically connected together, this means that the elements are directly connected with no intermediate element other than conductors. When reference is made to two elements electrically coupled together, this means that the two elements may be directly coupled (connected) or coupled via one or a plurality of other elements.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

It is understood that the embodiments of this disclosure are not limited to applications disclosed herein regarding the measurement of a voltage drop at a reserve capacitor in a supplemental restraint system. The various embodiments are also applicable to other applications that benefit from measuring a voltage drop at a terminal of an electronic circuit having an unknown baseline voltage.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for measuring a voltage drop at a node, the method comprising:
   having a circuit comprising an analog-to-digital converter, a current sink, and a controller, an input of the analog-to-digital converter and an input of the current sink coupled to the node;
   sampling a first output of the analog-to-digital converter during a first steady-state condition, the current sink disabled during the first steady-state condition;
   selectively adjusting an amount of current sunk through the current sink until the output of the analog-to-digital converter is at a targeted value relative to the first output;
   sampling an output of the analog-to-digital converter during the voltage drop; and
   computing a relative voltage drop value comprising subtracting the sampled output of the analog-to-digital converter during the voltage drop from a sampled output of the analog-to-digital converter during a second steady-state condition, the current sink operating at the targeted value during the second steady-state condition and during the voltage drop.

2. The method of claim 1, wherein selectively adjusting the amount of current sunk through the current sink comprises:
   monitoring the output of the analog-to-digital converter;
   adjusting the amount of current sunk by a control signal generated by the controller based on monitoring the output of the analog-to-digital converter; and
   communicating the control signal to a digital-to-analog converter (DAC) of the current sink.

3. The method of claim 1, wherein the targeted value corresponds to a ratio between 9.9 and 10.1 percent.

4. The method of claim 1, wherein the voltage drop comprises enabling a discharge switch coupled to the node such that a voltage at the node drops in value.

5. The method of claim 1, further comprising computing a voltage drop value at the node based on a linear relationship between the voltage drop and the relative voltage drop value.

6. The method of claim 1, wherein the targeted value is chosen to prevent the analog-to-digital converter from saturating.

7. The method of claim 1, wherein the node is a node of a reserve capacitor of a supplemental restraint system (SRS) in a vehicle.

8. The method of claim 1, wherein the analog-to-digital converter is a sigma-delta ($\Sigma$-$\Delta$) and the controller is a proportional-integral-derivative (PID) controller.

9. A circuit for measuring a voltage drop at a node, the circuit comprising:
   an analog-to-digital converter (ADC) coupled to the node;
   a current sink coupled to the node and an input of the analog-to-digital converter, the current sink configured to be adjusted via a control signal to selectively adjust an amount of current sunk through the current sink; and
   a controller coupled to an output of the analog-to-digital converter and a control input of the current sink, the controller configured to:
   sample a first output of the analog-to-digital converter during a first steady-state condition, the current sink disabled during the first steady-state condition, selectively adjust an amount of current sunk through the current sink until the output of the analog-to-digital converter is at a targeted value relative to the first output, sample an output of the analog-to-digital converter during the voltage drop, and compute a relative voltage drop value comprising subtracting the sampled output of the analog-to-digital converter during the voltage drop from a sampled output of the analog-to-digital converter during a second steady-state condition, the current sink operating at the targeted value during the second steady-state condition and during the voltage drop.

10. The circuit of claim 9, wherein the current sink comprises a digital-to-analog converter (ADC) and a load.

11. The circuit of claim 9, wherein the selectively adjusting the amount of current sunk through the current sink comprises:

monitoring the output of the analog-to-digital converter;

adjusting the amount of current sunk by a control signal generated by the controller based on monitoring the output of the analog-to-digital converter; and communicating the control signal to a digital-to-analog converter (DAC) of the current sink.

12. The circuit of claim 9, wherein the node is coupled to a discharge circuit, the voltage drop comprises enabling a discharge switch of the discharge circuit coupled to the node such that a voltage at the node drops in value.

13. The circuit of claim 9, wherein the controller is further configured to compute a voltage drop value at the node based on a linear relationship between the voltage drop and the relative voltage drop value.

14. The circuit of claim 9, wherein the targeted value is chosen to prevent the analog-to-digital converter from saturating.

15. The circuit of claim 9, wherein the analog-to-digital converter is a sigma-delta ($\Sigma$-$\Delta$) and the controller is a proportional-integral-derivative (PID) controller.

16. The circuit of claim 9, wherein the node is a node of a reserve capacitor in a supplemental restraint system (SRS) of a vehicle.

17. The circuit of claim 9, wherein the targeted value corresponds to a ratio between 9.9 and 10.1 percent.

18. A system, comprising:
a capacitor having a first node;
an analog-to-digital converter (ADC) coupled to the first node;
a current sink coupled to the first node and an input of the analog-to-digital converter, the current sink configured to be adjusted via a control signal to selectively adjust an amount of current sunk through the current sink; and
a controller coupled to an output of the analog-to-digital converter and a control input of the current sink, the controller configured to:
sample a first output of the analog-to-digital converter during a first steady-state condition, the current sink disabled during the first steady-state condition,
selectively adjust an amount of current sunk through the current sink until the output of the analog-to-digital converter is at a targeted value relative to the first output,
sample an output of the analog-to-digital converter during a voltage drop at the first node, and
compute a relative voltage drop value comprising subtracting the sampled output of the analog-to-digital converter during the voltage drop from a sampled output of the analog-to-digital converter during a second steady-state condition, the current sink operating at the targeted value during the second steady-state condition and during the voltage drop.

19. The system of claim 18, wherein the selectively adjusting the amount of current sunk through the current sink comprises:

monitoring the output of the analog-to-digital converter;

adjusting the amount of current sunk by a control signal generated by the controller based on monitoring the output of the analog-to-digital converter; and communicating the control signal to a digital-to-analog converter (DAC) of the current sink.

20. The system of claim 18, further comprising a discharge circuit coupled to the capacitor via the first node, the voltage drop comprises enabling a discharge switch of the discharge circuit coupled to the first node such that a voltage at the first node drops in value.

21. The system of claim 18, wherein the targeted value is chosen to prevent the analog-to-digital converter from saturating.

22. The system of claim 18, wherein the capacitor is a reserve capacitor of a supplemental restraint system (SRS) of a vehicle.

23. The system of claim 18, wherein the analog-to-digital converter is a sigma-delta ($\Sigma$-$\Delta$) and the controller is a proportional-integral-derivative (PID) controller.

* * * * *